United States Patent
Miyoshi

(10) Patent No.: US 9,065,252 B2
(45) Date of Patent: Jun. 23, 2015

(54) SEMICONDUCTOR LASER ELEMENT

(71) Applicant: NICHIA CORPORATION, Anan-shi (JP)

(72) Inventor: Takashi Miyoshi, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/096,782

(22) Filed: Dec. 4, 2013

(65) Prior Publication Data

US 2014/0161145 A1    Jun. 12, 2014

(30) Foreign Application Priority Data

Dec. 6, 2012 (JP) ................. P2012-267105

(51) Int. Cl.
| | |
|---|---|
| H01S 5/30 | (2006.01) |
| H01S 5/343 | (2006.01) |
| H01S 5/22 | (2006.01) |
| B82Y 20/00 | (2011.01) |
| H01S 5/042 | (2006.01) |
| H01S 5/20 | (2006.01) |
| H01S 5/32 | (2006.01) |

(52) U.S. Cl.
CPC ............ H01S 5/3013 (2013.01); *H01S 5/0425* (2013.01); *H01S 5/2031* (2013.01); H01S 5/22 (2013.01); *H01S 5/3211* (2013.01); H01S 5/3213 (2013.01); *H01S 5/34333* (2013.01); *H01S 2301/176* (2013.01); *H01S 2301/18* (2013.01); H01S 5/343 (2013.01); B82Y 20/00 (2013.01)

(58) Field of Classification Search
CPC . H01S 5/2031; H01S 5/3211; H01S 2301/18; H01S 5/321
USPC .................................................. 372/45.01
See application file for complete search history.

(56) References Cited

U.S. PATENT DOCUMENTS

| | | | |
|---|---|---|---|
| 6,556,603 B1 | 4/2003 | Yamasaki et al. | |
| 6,711,193 B2 | 3/2004 | Yamasaki | |
| 2002/0141469 A1 | 10/2002 | Yamasaki et al. | |
| 2003/0031220 A1* | 2/2003 | Takeuchi et al. ............... | 372/45 |
| 2004/0161010 A1 | 8/2004 | Matsumura | |
| 2007/0183469 A1 | 8/2007 | Ryu | |
| 2011/0220871 A1* | 9/2011 | Kamikawa et al. ............. | 257/13 |
| 2011/0243171 A1* | 10/2011 | Kano ...................... | 372/45.011 |
| 2012/0189030 A1 | 7/2012 | Miyoshi | |

FOREIGN PATENT DOCUMENTS

| | | |
|---|---|---|
| JP | 10-290047 A | 10/1998 |
| JP | 2001-148539 A | 5/2001 |
| JP | 2002-151798 A | 5/2002 |

(Continued)

*Primary Examiner* — Julio J Maldonado
*Assistant Examiner* — Michael Carter
(74) *Attorney, Agent, or Firm* — Foley & Lardner LLP

(57) ABSTRACT

A semiconductor laser element includes: a light emitting layer of a nitride semiconductor that is placed above a substrate of GaN and has a refractive index higher than the substrate, wherein the semiconductor laser element further includes the following layers between the substrate and the light emitting layer in an order from the substrate: a first nitride semiconductor layer of AlGaN; a second nitride semiconductor layer of AlGaN having an Al ratio higher than the first nitride semiconductor layer; a third nitride semiconductor layer of an InGaN; and a fourth nitride semiconductor layer of AlGaN having an Al ratio higher than the first nitride semiconductor layer and having a thickness greater than the second nitride semiconductor layer.

22 Claims, 4 Drawing Sheets

(56) References Cited

FOREIGN PATENT DOCUMENTS

| JP | 2002-190635 A | 7/2002 |
| JP | 2002-319744 A | 10/2002 |
| JP | 2002-335052 A | 11/2002 |
| JP | 2003-060314 A | 2/2003 |
| JP | 2004-111689 A | 4/2004 |
| JP | 2005-101483 A | 4/2005 |
| JP | 2007-214557 A | 8/2007 |
| WO | WO-2011/013621 A1 | 2/2011 |

\* cited by examiner

SEMICONDUCTOR LASER ELEMENT

BACKGROUND OF THE INVENTION

1. Field of the Invention

The present invention relates to a semiconductor laser element.

2. Description of the Related Art

In laser diode elements with laminated nitride semiconductor layers on a substrate, light is confined by sandwiching an active layer with layers having a refractive index lower than that of the active layer (see, for example, JP 2003-060314 A and JP 2007-214557 A).

SUMMARY OF THE INVENTION

In such semiconductor laser elements using a nitride semiconductor substrate, there has been a need for further reduction of the ripple of their far field pattern (FFP). Since the ripple is caused by leak light in the substrate, it is possible to reduce the ripple by reducing the light leaking out to the substrate.

A semiconductor laser element according to an embodiment of the present invention includes:

a light emitting layer of a nitride semiconductor that is placed above a substrate of GaN and has a refractive index higher than the substrate, wherein the semiconductor laser element further includes the following layers between the substrate and the light emitting layer in an order from the substrate:

a first nitride semiconductor layer of AlGaN;

a second nitride semiconductor layer of AlGaN having an Al ratio higher than the first nitride semiconductor layer;

a third nitride semiconductor layer of an InGaN; and a fourth nitride semiconductor layer of AlGaN having an Al ratio higher than the first nitride semiconductor layer and having a thickness greater than the second nitride semiconductor layer.

A semiconductor laser element according to another embodiment of the present invention includes:

a light emitting layer of a nitride semiconductor that is placed above a substrate of AlGaN, and has a refractive index higher than the substrate, wherein the semiconductor laser element further includes the following layers between the substrate and the light emitting layer in an order from the substrate:

a first nitride semiconductor layer of AlGaN;

a second nitride semiconductor layer of AlGaN having an Al ratio higher than the first nitride semiconductor layer;

a third nitride semiconductor layer of InGaN; and a fourth nitride semiconductor layer of AlGaN having an Al ratio higher than the first nitride semiconductor layer and having a thickness greater than the second nitride semiconductor layer.

With the present invention, it becomes possible to confine light well so as to reduce the ripple of the FFP in semiconductor laser elements using a nitride semiconductor substrate.

DETAILED DESCRIPTION OF THE INVENTION

An embodiment of the present invention will be described below with referenced to the accompanying drawings. The following embodiments are intended to exemplify a method for embodying the technical idea of the present invention, and the present invention is not limited to the following embodiments. Throughout the following description, identical names or reference signs designate identical or similar members, and the detailed descriptions thereof are suitably omitted.

Figure 1:
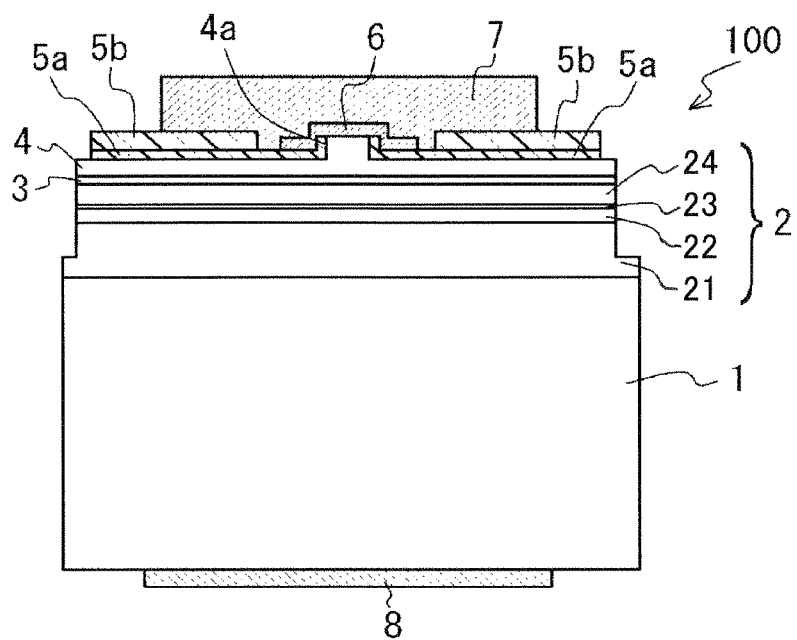
FIG. 1 is a schematic cross sectional view for describing an embodiment of the present invention.
Figure 2:
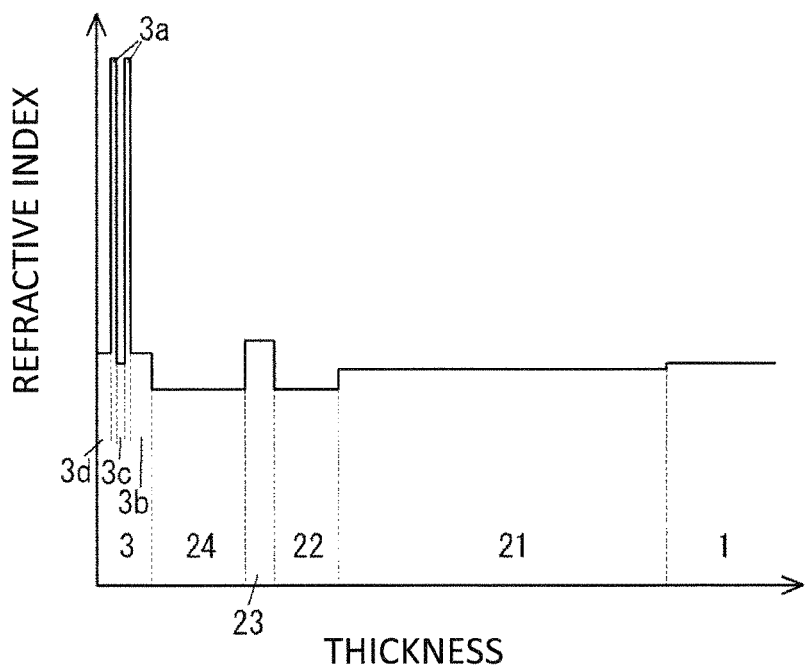
FIG. 2 is a schematic view illustrating the refractive indices of first to fourth nitride semiconductor layers.

FIG. 1 is a schematic cross sectional view for describing an embodiment of the present invention, illustrating a cross section perpendicular to the resonance direction of a semiconductor laser element 100. The semiconductor laser element 100 includes a substrate 1 of a nitride semiconductor and a light emitting layer of a nitride semiconductor above the substrate 1. The semiconductor light emitting element 100 includes an n-side nitride semiconductor layer 2, an active layer 3 and a p-side nitride semiconductor layer 4 in the order from the substrate 1. As illustrated in FIG. 2 for example, the active layer 3 includes barrier layers 3b, 3c and 3d and well layers (light emitting layers) 3a, which are alternately placed. The p-side nitride semiconductor layer 4 has a ridge 4a on the surface, and a waveguide is formed in the part of the active layer 3 corresponding to the ridge 4a and its surroundings. A first insulation film 5a is provided on the side face of the ridge 4a and the surface of the p-side nitride semiconductor layer 4 continuing from the side face of the ridge 4a. Further, a second insulation film 5b is provided on the first insulation film 5a covering a part of the first insulation film 5a. A p-electrode 6 and a pad electrode 7 are provided on the surface of the p-side nitride semiconductor layer 4, and an n-electrode 8 is provided on the back face of the substrate 1.

Between the active layer 3 including the light emitting layer and the substrate 1, there are a first nitride semiconductor layer 21, a second nitride semiconductor layer 22, a third nitride semiconductor layer 23 and a fourth nitride semiconductor layer 24 in the order from the substrate 1. FIG. 2 is a schematic view illustrating the refractive indices of these layers. The schematic view of FIG. 2 is intended to describe the refractive indices, and the layer structure and thickness are partly different from those of Example 1 mentioned below. Further, the p-side nitride semiconductor layer 4 and fifth and sixth nitride semiconductor layers 25 and 26 are omitted in the drawing.

As illustrated in FIG. 2, the refractive indices of the first to fourth nitride semiconductor layers 21 to 24 are all lower than that of the light emitting layer 3a. Of the four layers, the third nitride semiconductor layer 23 has the highest refractive index. The refractive indices of the second nitride semiconductor layer 22 and the fourth nitride semiconductor layer 24 are lower than the refractive index of the first nitride semiconductor layer 21. The refractive index of the substrate 1 is lower than the refractive index of the light emitting layer 3a, but is higher than the refractive index of the first nitride semiconductor layer 21.

Figure 3:
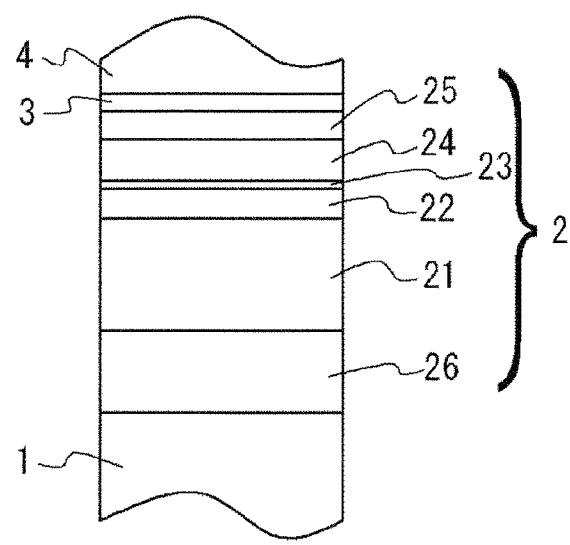
FIG. 3 is a schematic cross sectional view for describing a variation of an embodiment of the present invention.
Figure 4:
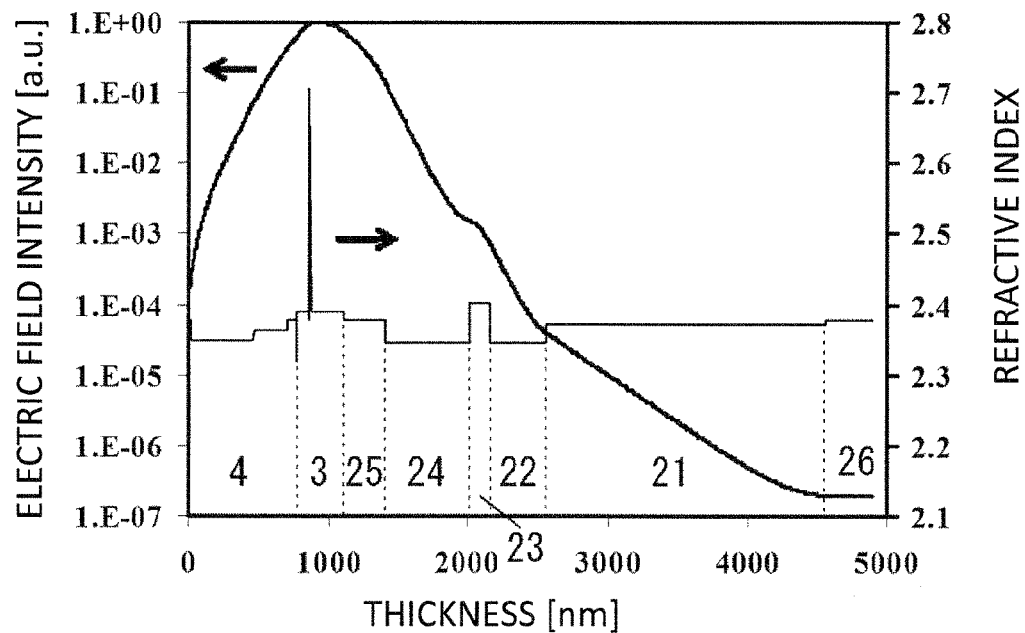
FIG. 4 is a graph illustrating a simulation result of the refractive index and the electric field intensity of a semiconductor laser element of Example 1.

FIG. 4 illustrates a simulation result of the refractive index and the electric field intensity of a semiconductor laser element of Example 1 mentioned below. The layer structure of the n-side nitride semiconductor layer 2 in FIG. 4 corresponds to the layer structure illustrated in FIG. 3. In FIG. 4, the horizontal axis represents the thickness in the lamination direction in which the top face (p-electrode side) of the semiconductor layers is referenced as 0 nm. That is, the horizontal axis represents a depth position in which the top face (p-electrode side) of the semiconductor layer is referenced as 0 nm as the thickness of the semiconductor layers present above the position, and a higher value means that the position is closer to the substrate. The right vertical axis represents the refractive index, and the left vertical axis represents the electric field intensity. The electric field intensity is plotted as a relative value with respect to the maximum value of 1. The electric field intensity corresponds to the light intensity, and decrease in the electric field intensity in the substrate means decrease in the light leaking out to the substrate. That is, a low electric light intensity in the substrate means a reduced light leaking out to the substrate. As is described below, the semiconductor laser element of Example 1 includes a sixth nitride semiconductor layer 26 in contact with the substrate. Since the sixth nitride semiconductor layer 26 has the same refractive index as the substrate, there is very small difference in electric field intensity between the sixth semiconductor layer 26 and the substrate. Accordingly, when the electric field intensity is low in the sixth nitride semiconductor layer 26, it can be considered that the electric field intensity is similarly low in the substrate.

In the embodiment, the first nitride semiconductor layer 21 is provided on or above the substrate 1, and the second to fourth nitride semiconductor layers 22 to 24 are further provided between the first nitride semiconductor layer 21 and the light emitting layer in a specific order. The semiconductor laser element with the above-described structure has a refractive index distribution as illustrated in FIG. 2. With the above-described structure, the light emerging from the active layer 3 including the light emitting layer is confined due to the refractive index difference between the active layer 3 and the fourth nitride semiconductor layer 24 of AlGaN having a lower refractive index. The light is further confined due to the refractive index difference between the third nitride semiconductor layer 23 of InGaN and the second nitride semiconductor layer 22 of AlGaN. Since the third nitride semiconductor layer 23 is a high refractive index layer made of InGaN, the electric field intensity experiences less attenuation in the third nitride semiconductor layer 23, and the light tends to be accumulated there. This can be understood from the graph of FIG. 4 in which the electric field intensity curve has a mild slope at the part corresponding to the third nitride semiconductor layer 23. The third nitride semiconductor layer 23 provided next to the second nitride semiconductor layer 22 on the side facing the light emitting layer allows for effective optical confinement by utilizing the refractive index difference between the third nitride semiconductor layer 23 and the second nitride semiconductor layer 22. In other words, the optical confinement by the second nitride semiconductor layer 22 is further enhanced. Further, as illustrated in FIG. 4, even if the fifth nitride semiconductor layer 25 is provided between the active layer 3 and the fourth nitride semiconductor layer 24 and if it is made of, for example, InGaN having a small refractive index difference with the active layer 3, the light emerging from the active layer 3 including the light emitting layer is confined due to the refractive index difference between the fifth nitride semiconductor layer 25 and the fourth nitride semiconductor layer 24 since there is small refractive index difference between the active layer 3 and the fifth nitride semiconductor layer 25. With the structure of the embodiment that includes the second to fourth nitride semiconductor layers 22 to 24 placed in a specific order as described above, the electric field intensity is effectively attenuated before it reaches the substrate, which means reduced light leaking out to the substrate 1 resulting in reduced ripple of the FFP.

In the embodiment, the thickness of the fourth nitride semiconductor layer 24 is greater than the thickness of the second nitride semiconductor layer 22, and the third nitride semiconductor layer 23 is placed between the fourth nitride semiconductor layer 24 and the second nitride semiconductor layer 22. As described above, the ripple of the FFP can be reduced by utilizing the third nitride semiconductor layer 23 that tends to accumulate the light. However, if the third nitride semiconductor layer 23 is placed near the active layer (light emitting layer), the peak of the electric field intensity shifts toward the third nitride semiconductor layer 23, i.e. the peak of the electric field intensity shifts toward the substrate 1. Furthermore, the electric field intensity becomes extremely high in the third nitride semiconductor layer 23 since the third nitride semiconductor layer 23 is located near the peak of the electric field intensity. This may impair the symmetry of the FFP.

To cope with this, in the embodiment, the fourth nitride semiconductor layer 24 has a thickness greater than the second nitride semiconductor layer 22, and the third nitride semiconductor layer 23 is placed between them. This structure can provide optical confinement by the second nitride semiconductor layer 22, and can also prevent the third nitride semiconductor layer 23 from being located too close to the active layer (light emitting layer) and thereby suppress the peak of the electric field intensity from shifting toward the substrate 1. As a result, the ripple of the FFP can be effectively reduced while the symmetry of the FFP is maintained. Furthermore, due to its low refractive index, the fourth nitride semiconductor layer 24 can attenuate the electric field intensity before it reaches the third nitride semiconductor layer 23, and thereby prevent the electric field intensity from being excessively accumulated in the third nitride semiconductor layer 23. This is also preferred in terms of suppressing the peak of the electric field intensity from shifting toward the substrate 1.

As the peak of the electric field intensity shifts toward the substrate 1, the electric field intensity in the light emitting layer decreases due to increasing deviation of the peak from the light emitting layer. This may cause increase of the threshold or decrease of the quantum efficiency. In the embodiment, the above-described structure can suppress the peak shift of the electric field intensity toward the substrate 1, which results in suppressed increase of the threshold or suppressed decrease of the quantum efficiency.

On the surface of the original substrate 1 before laminating the semiconductor layers, there are normally impurities due to surface contamination, a damage layer such as scratches produced during the production, and the like. If an AlGaN having a high Al ratio is directly laminated on this substrate 1, it results in degraded surface flatness due to the high susceptibility of the AlGaN to the damage layer and impurities present on the surface of the substrate 1 because the surface migration of AlGaN decreases with an increase in the Al ratio. This degraded surface flatness affects the layers to be formed thereon, and eventually causes decrease of the quantum efficiency of the laser element, decrease of the reliability and decrease of the yield. To cope with this, in the embodiment, the second nitride semiconductor layer 22, which is an AlGaN layer having a low refractive index, i.e. having a high Al ratio, accompanies the first nitride semiconductor layer 21 on the side facing the substrate 1, which is an AlGaN layer having an Al ratio lower than the second nitride semiconductor layer 22. This can reduce the influence of the scratches and impurities of the surface of the substrate 1 on the second nitride semiconductor layer 22, and thereby suppress that the influence propagates to the other layers closer to the light emitting layer, which results in suppressing the decrease of the quantum efficiency of the laser element, the decrease of the reliability and the decrease of the yield.

If there is large lattice constant difference between the substrate 1 and the second nitride semiconductor layer 22, cracks tend to be developed. To cope with this, the embodiment employs the first nitride semiconductor layer 21 that is placed between the substrate 1 of GaN and the second nitride semiconductor layer 22 of AlGaN having a high Al ratio, and is an AlGaN layer having a low Al ratio and having an intermediate lattice constant between the lattice constant of the substrate 1 and the lattice constant of the second nitride semiconductor layer 22. This can suppress development of cracks. The same is true for the substrate 1 of AlGaN. That is, development of cracks can be suppressed by providing the first nitride semiconductor layer 21 that is placed between the substrate 1 of AlGaN having a low Al ratio and the second nitride semiconductor layer 22 of AlGaN having a high Al ratio, and is made of AlGaN having an Al ratio of more than that of the substrate 1 but less than that of the second nitride semiconductor layer 22.

Figure 5:
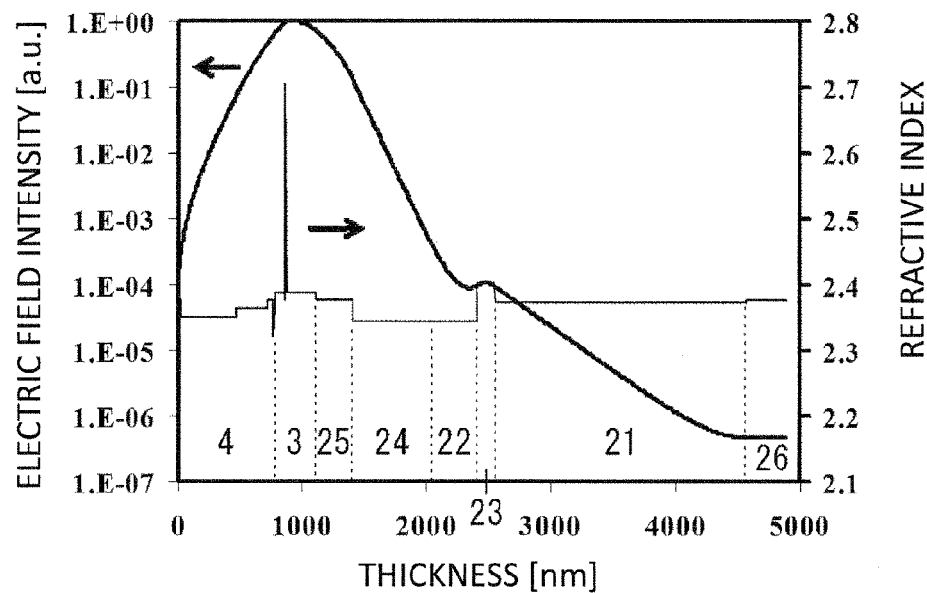
FIG. 5 is a graph illustrating a simulation result of the refractive index and the electric field intensity of a semiconductor laser element of Comparative Example 1.
Figure 6:
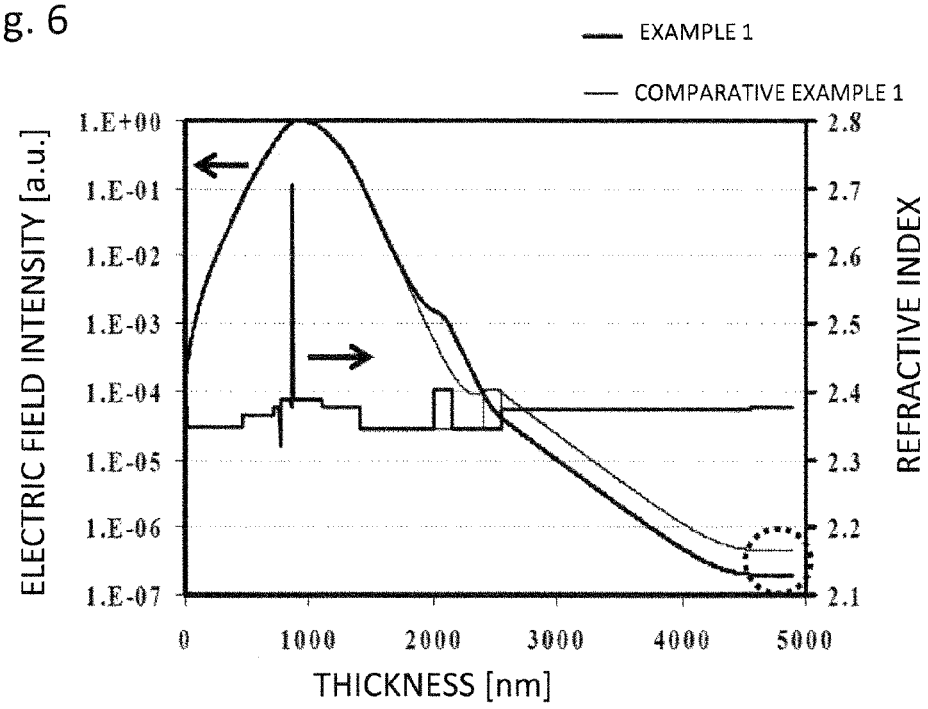
FIG. 6 is a graph illustrating the simulation results of the refractive index and the electric field intensity of the semiconductor laser elements of Example 1 and Comparative Example 1.

FIG. 5 is a view illustrating a simulation result of the refractive index and the electric field intensity of a semiconductor laser element of Comparative Example 1. Comparative example 1 has the same structure as the Example 1 except that the positions of the third nitride semiconductor layer 23 and second nitride semiconductor layer 22 of Example 1 are interchanged with each other. Further, FIG. 6 is a graph illustrating the refractive index and electric field intensity of Example 1 of FIG. 4 together with the refractive index and electric field intensity of Comparative Example 1 of FIG. 5. In FIG. 6, Example 1 is illustrated by the bold line, and Comparative Example 1 is illustrated by the narrow line. Since the electric field intensity corresponds to the light emitting intensity, decrease of the electric field intensity in the substrate means decrease of the light leaking out to the substrate. In the semiconductor laser elements of Example 1 and Comparative Example 1, the sixth nitride semiconductor layer 26 is in contact with the substrate and has the same refractive index as the substrate. Accordingly, a reduced electric field intensity in the sixth nitride semiconductor layer 26 can be considered as a reduced electric field intensity in the substrate.

In Example 1 and Comparative Example 1, the p-side nitride semiconductor layer 4 includes an Mg-doped AlGaN layer having a relatively high Al ratio, a GaN layer, an Mg-doped AlGaN layer having a relatively high Al ratio, an Mg-doped AlGaN/AlGaN superlattice layer and a Mg-doped GaN layer in the order from the active layer.

In FIG. 6, the electric field intensities in each sixth nitride semiconductor layer 26 are indicated by the dashed circle. In this regard, with the structure of Example 1, the sixth nitride semiconductor layer 26 has a reduced electric field intensity compared to Comparative Example 1. The decrease of the electric field intensity in the sixth nitride semiconductor layer 26 means decrease of the electric field intensity in the substrate, which eventually corresponds to decrease of the light leaking out to the substrate. That is, the structure of Example 1 can reduce the light leaking out to the substrate compared to Comparative Example 1. This will be further described in more detail below.

As illustrated in FIGS. 4 to 6, there is no difference between the laser element of Example 1 and the laser element of Comparative Example 1 in development of attenuation of the electric field intensity and the slope of its attenuation curve (i.e. attenuation rate) in the second nitride semiconductor layers 22 and fourth nitride semiconductor layers 24, both of which have a low refractive index. Also, it is common between the laser elements of Example 1 and Comparative Example 1 that the electric field intensity is retained in the third nitride semiconductor layers 23 having a high refractive index. That is, in the third nitride semiconductor layers 23, the attenuation curve (attenuation rate) of Example 1 has a mild slope while that of Comparative Example 1 even has a positive slope. However, the laser element of Example 1 is provided with the second nitride semiconductor layer 22 that is placed next to the third nitride semiconductor layer 23 on the side facing the substrate and this layer can attenuate the electric field intensity retained in the third nitride semiconductor layer 23 to a great extent. As a result, the laser element of Example 1 can reduce the electric field intensity before it reaches the substrate 1 to a greater extent than Comparative Example 1, which allows for reducing the light leaking out to the substrate. Furthermore, in Example 1, since the fourth nitride semiconductor layer 24, which is placed next to the third nitride semiconductor layer 23 on the side facing the light emitting layer, has a thickness greater than the second nitride semiconductor layer 22, the peak of the electric field intensity rarely shifts and is maintained at approximately the same position as Comparative Example 1.

Hereinafter, each component will be described in detail.
(Substrate 1)

The substrate 1 is made of GaN or AlGaN. Typically, GaN is used. The use of nitride semiconductor substrates such as GaN and AlGaN makes the refractive index difference between the nitride semiconductor layers formed on the substrate and the substrate smaller compared to dissimilar substrates such as sapphire substrates. Since this results in reduced light reflection caused by the refractive index difference between the nitride semiconductor layer and the substrate, the light readily seeps out to the substrate. To cope with this, the embodiment employs the first to fourth nitride semiconductor layers 21 to 24 to confine the light inside the nitride semiconductor layers to prevent the light from leaking out to the substrate, so as to reduce the ripple.

In a semiconductor laser element using a GaN substrate or an AlGaN substrate and having an elongated lasing wavelength (peak wavelength) of 480 nm or more, the substrate exhibits decreased light absorption for the light emerging from the light emitting layer. Therefore, the light seeping out to the substrate is likely to be extracted out of the element without being absorbed. This can be explained as follows. That is, when the light emitting layer has high band gap energy (a low In ratio if it is an InGaN light emitting layer) and when there is a small band gap energy difference with the substrate, the light emerging from the light emitting layer is readily absorbed in the substrate. Therefore, even if the light seeps out to the substrate, it is absorbed in the substrate and is less likely to be extracted out of the element. In contrast, when the light emitting layer has low band gap energy (a high In ratio if it is an InGaN light emitting layer) and when there is a large band gap energy difference with the substrate, the light emerging from the light emitting layer is less absorbed in the substrate. Therefore, the light seeping out to the substrate is likely to be extracted out of the element without being absorbed in the substrate.

In semiconductor laser elements using a GaN substrate or an AlGaN substrate and having an elongated lasing wavelength of 480 nm or more, it is particularly important to reduce leak of the light to the substrate as a countermeasure to the ripple, and it is therefore preferred to employ the first to fourth nitride semiconductor layers 21 to 24. If the light emitting layer is made of InGaN for example, a GaN substrate has a band gap energy closer to the light emitting layer than an AlGaN substrate. That is, if a GaN substrate is used, the absorption of the light from the light emitting layer in the substrate is more variable depending on whether the lasing wavelength is 480 nm or more. Therefore, when a GaN substrate is used, it is more preferred to employ the first to fourth nitride semiconductor layers 21 to 24. The lasing wavelength corresponds to the peak wavelength, or may correspond to a dominant wavelength.

The thickness of the substrate 1 is normally greater than the thickness of a semiconductor laminate that includes the light emitting layer and the first to fourth nitride semiconductor layers 21 to 24. Accordingly, the leak light in the substrate 1 tends to affect the FFP, and the ripple of the FFP can be reduced by reducing the light leaking out to the substrate 1 as the embodiment. Specifically, the thickness of the substrate 1 is preferably 30 µm or more, more preferably 50 µm or more. Regarding the upper limit of the thickness, it is preferred that the substrate 1 is thin enough for cleavage. Specifically, 150 µm or less is preferred, and 100 µm or less is more preferred.

(First to Fourth Nitride Semiconductor Layers 21 to 24)

In the semiconductor laser element of FIG. 1, the first to fourth nitride semiconductor layers 21 to 24 are provided on the substrate 1 in this order from the substrate 1, and are in contact with each other. The first and second nitride semiconductor layers 21 and 22 are made of AlGaN, and have a refractive index lower than the substrate 1. The higher the Al ratio of AlGaN is, the lower its refractive index is. The AlGaN of the second nitride semiconductor layer 22 has a higher Al ratio than the AlGaN of the first nitride semiconductor layer 21, and the second nitride semiconductor layer 22 accordingly serves as a low refractive index layer. Specifically, the second nitride semiconductor layer 22 is made of $Al_XGa_{1-X}N$ (0<X<1). Furthermore, the second nitride semiconductor layer 22 is made of preferably $Al_XGa_{1-X}N$ (0.04<X≤0.1), more preferably $Al_XGa_{1-X}N$ (0.06≤X≤0.1). The first nitride semiconductor layer 21 is made of $Al_YGa_{1-Y}N$ (0<Y<X), preferably $Al_YGa_{1-Y}N$ (0<Y≤0.04). These composition ranges are particularly preferred for semiconductor laser elements having a lasing wavelength of 480 nm or more. They are more preferred for semiconductor laser elements that oscillate a laser light having a peak wavelength from 480 nm to 550 nm, and still more preferred for those with a peak wavelength from 505 nm to 550 nm. The material of the fourth nitride semiconductor layer 24 may be AlGaN within the same composition range as the second nitride semiconductor layer 22. Further, the fourth nitride semiconductor layer 24 and the second nitride semiconductor layer 22 may be made of AlGaN having substantial the same composition.

If a single AlGaN layer having a high Al ratio like the second and fourth nitride semiconductor layers 22 and 24 is used for optical confinement, a comparatively thick layer is required to obtain a sufficient effect. However, such layers easily develop cracks. In the embodiment, such a layer is provided as divided two layers of the fourth nitride semiconductor layer 24 and the second nitride semiconductor layer 22. As a result, sufficient optical confinement is obtained with comparatively thin layers. Typically, for obtaining a certain level of optical confinement, the required total thickness of the fourth nitride semiconductor layer 24 and second nitride semiconductor layer 22 is approximately equal or less than the required thickness of a single layer. As a result, good optical confinement is obtained while development of cracks is prevented.

In the second nitride semiconductor layer 22 that is made of AlGaN having a high Al ratio, increase of the thickness tends to cause cracks. However, in the fourth nitride semiconductor layer 24 that is positioned on the third nitride semiconductor layer 23 of InGaN, it is possible to increase the thickness without causing cracks even if it is made of AlGaN having an Al ratio as high as the second nitride semiconductor layer 22. Accordingly, in order to reduce the ripple and to prevent development of cracks, it is preferred that the thickness of the fourth nitride semiconductor layer 24 is greater than the thickness of the second nitride semiconductor layer 22, and it is also preferred that the fourth nitride semiconductor layer 24 is made of AlGaN having an Al ratio higher than the first nitride semiconductor layer 21 as with the second nitride semiconductor layer 22.

Further, since the third nitride semiconductor layer is made of InGaN, this intervening layer between the two AlGaN layers can relieve the stress acting on these AlGaN layers, which can further prevent development of cracks. The third nitride semiconductor layer 23 is made of $In_ZGa_{1-Z}N$ (0<Z<1), preferably $In_ZGa_{1-Z}N$ (0.02≤Z≤0.06). This composition range is particularly preferred when the second and fourth nitride semiconductor layers 22 and 24 are made of $Al_XGa_{1-X}N$ within the above-described composition range. It is preferred that the third nitride semiconductor layer 23 is made of $In_ZGa_{1-Z}N$ (b≤Z<a) when the well layers 3a (light emitting layer) of the active layer 3 is made of $In_aGa_{1-a}N$ (0<a<1) and the barrier layer 3b of the active layer 3 located at the position closest to the substrate is made of $In_bGa_{1-b}N$ (0≤b<a).

If the semiconductor laser element includes the active layer 3 having quantum well structure (described below), the first, second and fourth nitride semiconductor layers 21, 22 and 24 have a refractive index at least lower than the light emitting layer (well layers 3a). In order to achieve optical confinement, it is preferred that their refractive indices are lower than the refractive indices of the barrier layers 3b to 3d. When there are the plurality of barrier layers, the refractive indices of the first, second and fourth nitride semiconductor layers 21, 22 and 24 are preferably lower than the refractive index of the barrier layer 3b located at the position closest to the substrate, more preferably lower than the refractive index of any of the barrier layers 3b to 3d. While the second and fourth nitride semiconductor layers 22 and 24 have such a low refractive index, the first nitride semiconductor layer 21 may have a high refractive index approximately equal or higher than barrier layers 3b to 3d. The third nitride semiconductor layer 23 may have a refractive index higher than the substrate 1 but lower than the light emitting layer 3a. Further, it may have a refractive index higher than the barrier layers 3b to 3d.

In order to use the first to fourth nitride semiconductor layers 21 to 24 to obtain optical confinement, it is preferred that the first to fourth nitride semiconductor layers 21 to 24 have a certain thickness. Specifically, it is preferred that each of them has a thickness of more than 10 nm. Furthermore, it is preferred that the second nitride semiconductor layer 22 has a thickness of 100 nm or more. Also, it may have a thickness of 1 µm or less. When it is made of AlGaN within the above-described composition range, development of cracks are prevented within this thickness range. More preferably, the thickness is 300 nm or more and 800 nm or less. The fourth nitride semiconductor layer 24 may have a thickness within the same thickness range as the second nitride semiconductor layer 22. This thickness range is preferred because development of cracks is prevented when it is an AlGaN layer having a high Al ratio which falls within the same compositional range as the second nitride semiconductor layer 22. Further, it is preferred that the thickness of the fourth nitride semiconductor layer 24 is greater than the thickness of the second nitride semiconductor layer 22, in which the difference in thickness is, for example, 10 nm or more, or may be 200 nm or more.

It is preferred that the thickness of the first nitride semiconductor layer 21 is greater than the thickness of at least one of the second and fourth nitride semiconductor layers 22 and 24. Because the refractive index of the first nitride semiconductor layer 21 is higher than that of the second nitride semiconductor layer 22, it is preferred that the thickness of the first nitride semiconductor layer 21 is greater than the thickness of the second nitride semiconductor layer 22 so as to enhance the optical confinement. The same applies to the fourth nitride semiconductor layer 24, and it is preferred that the thickness of the first nitride semiconductor layer 21 is greater than the thickness of the fourth nitride semiconductor layer 24 since the optical confinement is enhanced. It is more preferred that the thickness of the first nitride semiconductor layer 21 is greater than the total thickness of the second and fourth nitride semiconductor layers 22 and 24. The thickness of the first nitride semiconductor layer 21 is preferably 100 nm or more, more preferably 500 nm or more, and still more preferably 1 μm or more. Further, the thickness of the first nitride semiconductor layer 21 is preferably 5 μm or less, more preferably 3 μm or less.

It is preferred that the third nitride semiconductor layer 23 has a thickness enough to readily accumulate the light. Specifically, the thickness is 50 nm or more, preferably 100 nm or more, and may be 1 μm or less. By accumulating the light in the third nitride semiconductor layer 23, the light is effectively confined due to the refractive index difference with the adjacent second nitride semiconductor layer 22. Further, in order to avoid excessive accumulation of the light to the third nitride semiconductor layer 23, the thickness of the third nitride semiconductor layer 23 is preferably at least less than the thickness of the second nitride semiconductor layer 22, more preferably less than the thickness of any of the first, second and fourth nitride semiconductor layers 21, 22 and 24. Specifically, the thickness may be 300 nm or less.

Another layer may be provided between the first to fourth nitride semiconductor layers 21 to 24 and the active layer 3 or between the first to fourth nitride semiconductor layers 21 to 24 and the substrate 1. FIG. 3 is a schematic cross sectional view for describing a variation of the embodiment. As illustrated in FIG. 3, the semiconductor laser element may include the fifth nitride semiconductor layer 25 between the fourth nitride semiconductor layer 24 and the active layer 3 (light emitting layer 3a), and may further include the sixth nitride semiconductor layer 26 between the first nitride semiconductor layer 21 and the substrate 1. The fifth nitride semiconductor layer 25 may be provided in contact with the barrier layer 3b, which is a layer of the active layer 3 located at the position closest to the substrate, and may have band gap energy higher than the barrier layer 3b. The sixth nitride semiconductor layer 26 may have the same composition as the substrate 1.

Another advantage of preventing development of cracks by the above-described structure of the embodiment is a wide variety of available substrates. Of nitride semiconductor substrates such as GaN, some substrates known in the art have both high dislocation density regions and low dislocation density regions. Among such substrates, a substrate with stripe high dislocation density regions is advantageous in that development of cracks have less influence on the yield because the high dislocation density regions can prevent propagation of cracks. In contrast, in a substrate with dot high dislocation density regions or a substrate with no high dislocation density region, cracks readily propagate in a broad area due to the small proportion or absence of high dislocation density regions. However, by preventing development of cracks, the yield can be maintained as high as that obtained by the substrate with stripe high dislocation density regions even if these substrates are used.

(n-Side Nitride Semiconductor Layer 2, p-Side Nitride Semiconductor Layer 4)

The p-side nitride semiconductor layer 4 includes a p-type nitride semiconductor layer doped with a p-type impurity such as Mg, and the n-side nitride semiconductor layer 2 includes an n-type nitride semiconductor layer doped with an n-type impurity such as Si. If the first to fourth nitride semiconductor layers 21 to 24 are provided as the n-side nitride semiconductor layer 2 for example, it is preferred that they are n-type nitride semiconductor layers doped with an n-type impurity such as Si because they preferably have a certain thickness as described above.

(Active Layer 3)

The active layer 3 includes the light emitting layer, and preferably has a quantum well structure in which the well layer (light emitting layer) are sandwiched by the barrier layers. For example, as illustrated in FIG. 2, it may have a multiple quantum well structure in which the plurality of barrier layers 3b, 3c and 3d and the plurality of well layers 3a are alternately laminated. Each well layer may be made of $In_aGa_{1-a}N$ (0<a<1), and each barrier layer may be made of InGaN, GaN, AlGaN or the like that has a band gap energy higher than the well layers.

The semiconductor laser element of the embodiment has a lasing wavelength (peak wavelength) of preferably 480 nm or more, more preferably from 480 nm to 550 nm, and still more preferably from 505 nm to 550 nm. For the laser element that oscillates a laser light having a peak wavelength of 480 nm or more, the well layer is preferably made of $In_aGa_{1-a}N$ (0.18≤a<1). For the laser element that oscillates a laser light having a peak wavelength from 480 nm to 550 nm, the well layer is preferably made of $In_aGa_{1-a}N$ (0.18≤a≤0.35). For the laser element that oscillates a laser light having a peak wavelength from 505 nm to 550 nm, the well layer is preferably made of $In_aGa_{1-a}N$ (0.2≤a≤0.35). In these cases, the barrier layers are preferably made of $In_bGa_{1-b}N$ (0≤b<0.18).

In the semiconductor laser element, the light with a long lasing wavelength is difficult to be confined due to refractive index dispersion depending on wavelength. In nitride semiconductors, a plot of change of the refractive index with respect to wavelength makes a curve like a normal distribution, and the peak position thereof varies depending on the composition. Accordingly, within a certain wavelength range, the rate of change of the refractive index with respect to wavelength varies depending on the composition. For example, GaN and $Al_{0.1}Ga_{0.9}N$ both has a lower refractive index at a wavelength of 500 nm than at a wavelength of 400 nm, but GaN exhibits a greater decrease. That is, from 400 nm to 500 nm, the refractive index of GaN greatly decreases while the refractive index of $Al_{0.1}Ga_{0.9}N$ decreases little. Since the refractive index of GaN is higher than $Al_{0.1}Ga_{0.9}N$, the refractive index difference between GaN and $Al_{0.1}Ga_{0.9}N$ becomes smaller at a longer wavelength. Accordingly, the refractive index difference is smaller at a wavelength of 500 nm than at a wavelength of 400 nm.

Because of such refractive index dispersion depending on wavelength, it becomes more difficult to obtain high refractive index differences between the layers as the lasing wavelength becomes longer, which tends to results in weak optical confinement. Therefore, it is particularly preferred that the structure of the embodiment is applied to semiconductor laser elements having a lasing wavelength of 480 nm or more, more preferably from 480 nm to 550 nm, and still more preferably from 505 nm to 550 nm.

If the well layer is made of InGaN having a high In ratio, an InGaN having a low in ratio and an intermediate lattice constant may be provided between the well layer and a major barrier layer (e.g. a GaN layer having a thickness of several nm). The thickness of this InGaN is, for example, approximately several angstroms. Further, if a Si-doped layer (e.g. a Si-doped GaN layer having a thickness of approximately 10 nm) is provided next to the well layer on the side facing the substrate, an undoped layer having the same composition (e.g. a GaN layer having a thickness of several nm) may be further provided next to the Si-doped layer at the side facing the substrate 1. This undoped layer may be sandwiched by Si-doped layers. For example, after the n-type nitride semiconductor layer is formed on the substrate 1, a several hundred nm $In_{0.03}Ga_{0.97}N$, an approximately 1 nm Si-doped GaN, a several nm GaN, an approximately 10 nm Si-doped GaN, a several angstrom $In_{0.15}Ga_{0.85}N$, a several nm $In_{0.25}Ga_{0.75}N$ (well layer), a several angstrom $In_{0.15}Ga_{0.85}N$ and a several nm GaN may be formed thereon in this order.

Example 1

As Example 1, a semiconductor laser element that includes a light emitting layer on an n-type GaN substrate and emits a laser light having a peak wavelength of 505 nm was prepared. An n-electrode was provided on the lower face (back face of the n-type GaN substrate), and a p-electrode was provided on the upper face. In the order from the substrate 1, the semiconductor laser element of Example 1 included a Si-doped GaN layer (sixth nitride semiconductor layer 26), an approximately 2000 nm Si-doped $Al_{0.018}Ga_{0.992}N$ layer (first nitride semiconductor layer 21), an approximately 400 nm Si-doped $Al_{0.08}Ga_{0.92}N$ layer (second nitride semiconductor layer 22), an approximately 150 nm Si-doped $In_{0.05}Ga_{0.95}N$ layer (third nitride semiconductor layer 23), an approximately 600 nm Si-doped $Al_{0.08}Ga_{0.92}N$ layer (fourth nitride semiconductor layer 24), a Si-doped GaN layer (fifth nitride semiconductor layer 25), a Si-doped InGaN barrier layer, a Si-doped GaN barrier layer, an $In_{0.25}Ga_{0.75}N$ well layer (light emitting layer), a GaN barrier layer, an $In_{0.25}Ga_{0.75}N$ well layer (light emitting layer), a InGaN barrier layer, an Mg-doped AlGaN layer, a GaN layer, an Mg-doped AlGaN layer, an Mg-doped AlGaN/AlGaN superlattice layer and an Mg-doped GaN layer.

FIGS. 4 and 5 illustrate simulation results of the refractive index and the electric field intensity of the semiconductor laser elements of Example 1 and Comparative Example 1. The semiconductor laser element of Comparative Example 1 is as same as Example 1 except that the positions of the second nitride semiconductor layer and the third nitride semiconductor layer are interchanged with each other. Although it is difficult to distinguish in FIGS. 4 and 5 because they are as thin as several nm to tens of nm, there are two well layers (light emitting layers), and there is also an Mg-doped GaN layer on the top face (around 0 nm thickness). As illustrated in FIGS. 4 and 5, the electric field intensity in the sixth nitride semiconductor layer 26, which is positioned under the first nitride semiconductor layer 21, is approximately $2 \times 10^{-7}$ in Example 1 and approximately $4.7 \times 10$ in Comparative Example 1. With the structure of Example 1, the electric field intensity in the sixth nitride semiconductor layer 26 can be reduced to a half or less compared to Comparative Example 1, which results in reduced light seeping out to the substrate.

In the laser elements of Example 1 and Comparative Example 1, the sixth nitride semiconductor layer 26 corresponds to the GaN layer that is provided in contact with the upper face of the GaN substrate, i.e. the layer in contact with the substrate and having the same refractive index as the substrate. Accordingly, the electric field intensity changes extremely little in the sixth nitride semiconductor layer 26, and the reduced value of the electric field intensity in the sixth nitride semiconductor layer 26 can be considered as the reduced value of the electric field intensity in the substrate.

Figure 7:
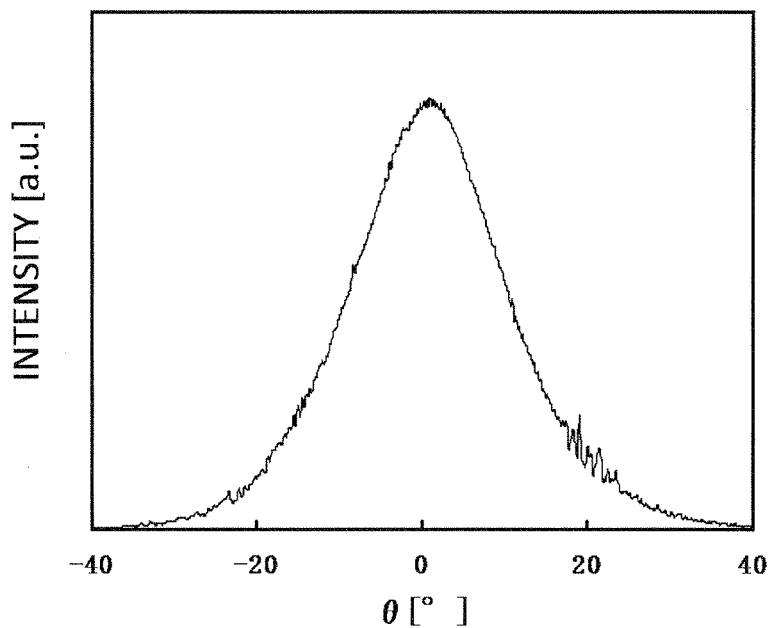
FIG. 7 is a graph illustrating the vertical $FFP_\perp$ of the semiconductor laser element of Example 1.
Figure 8:
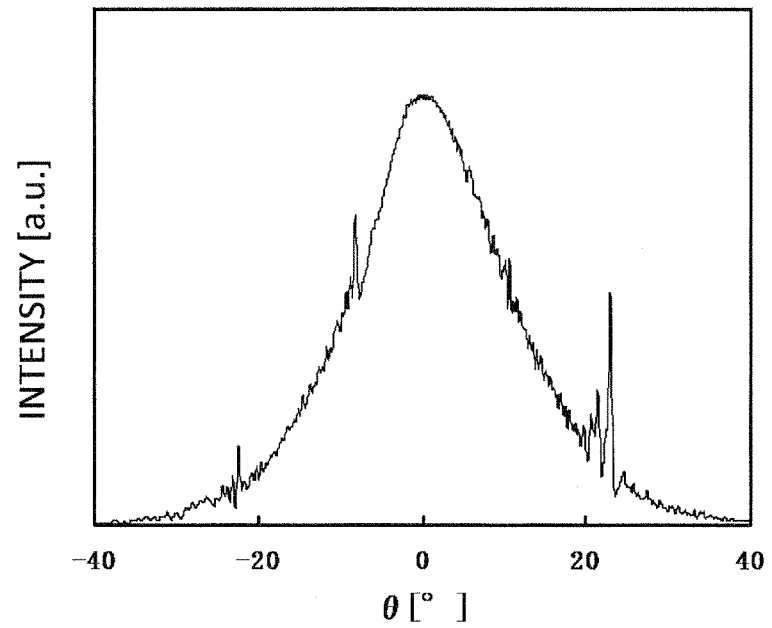
FIG. 8 is a graph illustrating the vertical $FFP_\perp$ of the semiconductor laser element of Comparative Example 1.

Further, the FFP in the lamination direction of the semiconductor layers, i.e. the FFP in the direction perpendicular to the active layer 3 (light emitting layer), of each semiconductor laser element of Example 1 and Comparative Example 1 was measured. FIG. 7 illustrates the vertical FFP of the semiconductor laser element of Example 1, and FIG. 8 illustrates the vertical FFP of the semiconductor laser element of Comparative Example 1. In FIGS. 7 and 8, the left side is the p-electrode side and the right side is the GaN substrate side. While a large ripple was observed around 20 degrees in the semiconductor laser element of Comparative Example 1, the ripple was reduced in the semiconductor laser element of the Example 1.

What is claimed is:

1. A semiconductor laser element comprising:
   a substrate of GaN;
   a first nitride semiconductor layer of AlGaN on or above the substrate;
   a second nitride semiconductor layer of AlGaN on or above the first nitride semiconductor layer, the second nitride semiconductor layer having an Al ratio higher than the first nitride semiconductor layer;
   a third nitride semiconductor layer of an InGaN on or above the second nitride semiconductor layer; and
   a fourth nitride semiconductor layer of AlGaN on or above the third nitride semiconductor layer, the fourth nitride semiconductor layer having an Al ratio higher than the first nitride semiconductor layer and having a thickness greater than the second nitride semiconductor layer; and
   a light emitting layer of a nitride semiconductor on or above the fourth nitride semiconductor layer, the light emitting layer having a refractive index higher than the substrate.

2. The semiconductor laser element according to claim 1, wherein the semiconductor laser element is configured to emit light having a lasing wavelength of 480 nm or more.

3. The semiconductor laser element according to claim 1, wherein a thickness of the second nitride semiconductor layer and a thickness of the fourth nitride semiconductor layer are 100 nm or more.

4. The semiconductor laser element according to claim 3, wherein a thickness of the third nitride semiconductor layer is 50 nm or more.

5. The semiconductor laser element according to claim 4, wherein a thickness of the first nitride semiconductor layer is 100 nm or more.

6. The semiconductor laser element according to claim 5, wherein a thickness of the first nitride semiconductor layer is larger than a total thickness of the second nitride semiconductor layer and fourth nitride semiconductor layer.

7. The semiconductor laser element according to claim 1, wherein a thickness of the third nitride semiconductor layer is 50 nm or more.

8. The semiconductor laser element according to claim 1, wherein a thickness of the first nitride semiconductor layer is 100 nm or more.

9. The semiconductor laser element according to claim 1, wherein a thickness of the first nitride semiconductor layer is larger than thicknesses of the second and fourth nitride semiconductor layer.

10. The semiconductor laser element according to claim 1, wherein a thickness of the first nitride semiconductor layer is larger than a total thickness of the second nitride semiconductor layer and fourth nitride semiconductor layer.

11. The semiconductor laser element according to claim 1, comprising a quantum well layer as the light emitting layer and barrier layers sandwiching the quantum well layer, wherein the first, second and fourth nitride semiconductor layers have a refractive index lower than a refractive index of the barrier layers.

12. The semiconductor laser element according to claim 1, wherein the semiconductor laser element is configured to emit light having a lasing wavelength of between 480 nm and 550 nm.

13. A semiconductor laser element comprising:
a substrate of AlGaN;
a first nitride semiconductor layer of AlGaN on or above the substrate;
a second nitride semiconductor layer of AlGaN on or above the first nitride semiconductor layer, the second nitride semiconductor layer having an Al ratio higher than the first nitride semiconductor layer;
a third nitride semiconductor layer of an InGaN on or above the second nitride semiconductor layer; and
a fourth nitride semiconductor layer of AlGaN on or above the third nitride semiconductor layer, the fourth nitride semiconductor layer having an Al ratio higher than the first nitride semiconductor layer and having a thickness greater than the second nitride semiconductor layer; and
a light emitting layer of a nitride semiconductor on or above the fourth nitride semiconductor layer, the light emitting layer having a refractive index higher than the substrate.

14. The semiconductor laser element according to claim 13, wherein the semiconductor laser element is configured to emit light having a lasing wavelength of 480 nm or more.

15. The semiconductor laser element according to claim 13, wherein a thickness of the second nitride semiconductor layer and a thickness of the fourth nitride semiconductor layer are 100 nm or more.

16. The semiconductor laser element according to claim 13, wherein a thickness of the third nitride semiconductor layer is 50 nm or more.

17. The semiconductor laser element according to claim 13, wherein a thickness of the first nitride semiconductor layer is 100 nm or more.

18. The semiconductor laser element according to claim 13, wherein a thickness of the first nitride semiconductor layer is larger than thicknesses of the second and fourth nitride semiconductor layer.

19. The semiconductor laser element according to claim 13, wherein a thickness of the first nitride semiconductor layer is larger than a total thickness of the second nitride semiconductor layer and fourth nitride semiconductor layer.

20. The semiconductor laser element according to claim 13, comprising a quantum well layer as the light emitting layer and barrier layers sandwiching the quantum well layer, wherein the first, second and fourth nitride semiconductor layers have a refractive index lower than a refractive index of the barrier layers.

21. The semiconductor laser element according to claim 13, wherein the semiconductor laser element is configured to emit light having a lasing wavelength of between 480 nm and 550 nm.

22. The semiconductor laser element according to claim 13, wherein the first nitride semiconductor layer has an Al ratio higher than the substrate.

* * * * *